United States Patent [19]

Deguchi et al.

[11] Patent Number: 5,084,107
[45] Date of Patent: Jan. 28, 1992

[54] SOLAR CELL AND SOLAR CELL ARRAY WITH ADHERED ELECTRODE

[75] Inventors: Mikio Deguchi; Takushi Itagaki; Masaaki Usui, all of Itami, Japan

[73] Assignee: Mitsubishi Denki Kabushiki Kaisha, Japan

[21] Appl. No.: 482,712

[22] Filed: Feb. 21, 1990

[30] Foreign Application Priority Data

Jun. 5, 1989 [JP] Japan .................... 1-142480

[51] Int. Cl.⁵ .................... H01L 31/04; H01L 31/0224
[52] U.S. Cl. .......................... 136/256; 437/2; 437/180; 357/30; 357/65; 357/68
[58] Field of Search ............ 136/256; 357/30 J, 30 Q, 357/65, 68; 437/180, 2

[56] References Cited

U.S. PATENT DOCUMENTS

| | | | |
|---|---|---|---|
| 3,442,007 | 5/1969 | Griffin et al. | 228/179 |
| 3,888,697 | 6/1975 | Bogus et al. | 136/260 |
| 4,260,429 | 4/1981 | Moyer | 136/256 |
| 4,283,591 | 8/1981 | Boër | 136/256 |
| 4,348,546 | 9/1982 | Little | 136/256 |
| 4,612,410 | 9/1986 | Hewig et al. | 136/256 |
| 4,695,674 | 9/1987 | Bar-On | 136/256 |

FOREIGN PATENT DOCUMENTS

| | | | |
|---|---|---|---|
| 0201745 | 11/1986 | European Pat. Off. | 136/256 |
| 3317309 | 11/1984 | Fed. Rep. of Germany | 136/256 |
| 2554277 | 5/1985 | France | 136/256 |
| 55-27995 | 8/1953 | Japan | 136/256 |
| 56-91460 | 12/1954 | Japan | 136/256 |

*Primary Examiner*—Aaron Weisstuch
*Attorney, Agent, or Firm*—Leydig, Voit & Mayer

[57] ABSTRACT

An electrode structure of a solar cell includes a metal wire fixed to the light incident surface of the solar cell with an electrically conductive adhesive. An electrode production method of a solar cell includes applying an electrically conductive adhesive to at least one of a portion of a metal wire and a portion of the light incident surface of the solar cell, pressing the metal wire into a predetermined position of the light incident surface of the solar cell, and solidifying the conductive adhesive to fix the metal wire.

18 Claims, 10 Drawing Sheets

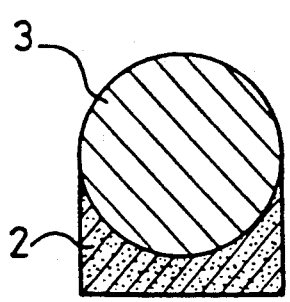
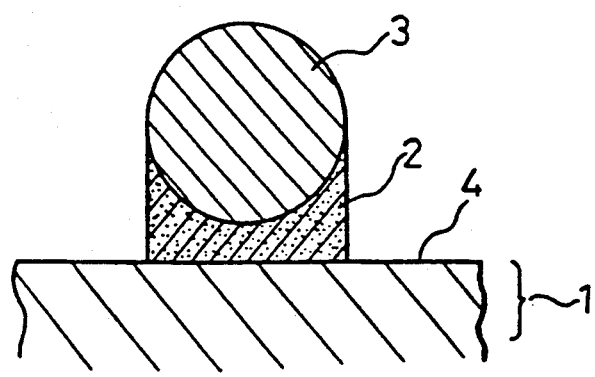

F I G. 4.
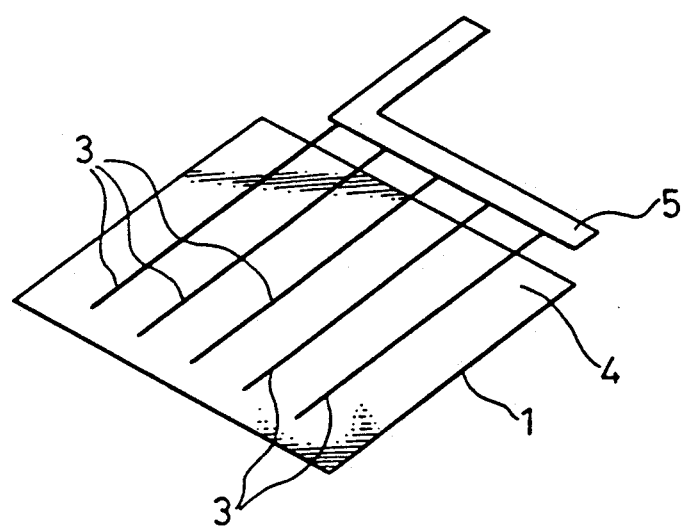
F I G. 5.
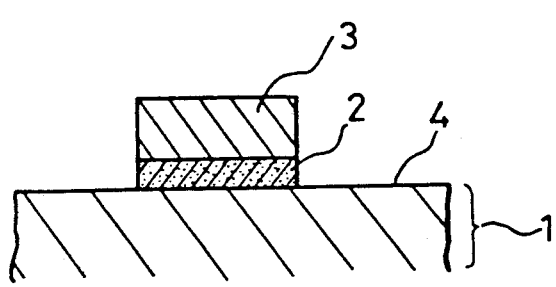
F I G. 6.
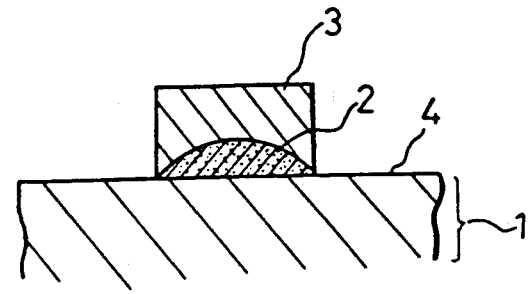

SOLAR CELL AND SOLAR CELL ARRAY WITH ADHERED ELECTRODE

FIELD OF THE INVENTION

The present invention relates to a solar cell and, more particularly, to an electrode structure, a production method therefor, and a production apparatus therefor.

BACKGROUND OF THE INVENTION

In a prior art solar cell, an electrode is produced by directly plating a low resistance metal on a surface of solar cell using vacuum evaporation or sputtering or by screen printing a conductive resin on the surface of solar cell and baking it.

FIG. 10 shows a prior art electrode production method using vacuum evaporation. In FIG. 10, reference numeral 1 designates a solar cell having a surface 4. Reference numeral 20 designates a metal mask. Reference numeral 21 designates a low resistance metal, reference numeral 22 designates an electron gun, and reference numeral 23 designates an electron beam.

In this method, the metal mask 20 having an aperture is disposed on the surface 4 of solar cell 1, and the low resistance metal 21 is heated and evaporated by irradiation with the electron beam 23, whereby an electrode comprising a metal thin film is deposited on the surface 4 of solar cell 1 in a high vacuum.

FIG. 11 shows another prior art electrode production method using screen printing. In this method, a conductive resin 25 is applied on the surface 4 of solar cell 1 through an aperture of screen mask 26 using printing means 24, and thereafter, the conductive resin 25 is baked, thereby producing an electrode. In this method, an electrode of larger film thickness is obtained than that obtained by the above-described vacuum evaporation method or sputtering method.

FIG. 12(a) shows a plan view of a solar cell having a conventional electrode structure. FIG. 12(b) shows a cross-section along line XIIb—XIIb of FIG. 12(a). In these figures, an electrode pattern 27 comprising a metal film is disposed on the surface 4 of solar cell 1 by the above-described method. A ribbon of conductive material 28 for transmitting the generated current outside the solar cell 1 is adhered to a predetermined portion of metal film 27 by solder 29.

The device will operate as follows.

The current generated in the solar cell 1 flows into the electrode 27 comprising a metal film via the surface of solar cell 1. Then, the generated current flows through the electrode 27 to the ribbon of conductive material 28 for transmitting the current outside the soloar cell which is fixed to a predetermined portion of electrode 27 by solder 29 or a conductive resin, and the generated electric power is supplied to an external element.

In the path of the generated current, power loss arises due to series resistances of the surface and the electrode. In order to minimize the power loss, the electrode pattern is determined by selecting various parameters such as sheet resistance, contact resistance between the surface and the electrode, width, thickness, and number of the electrodes, resistivity of electrode material, and current density generated by the solar cell. Then, the electrode pattern 27 is produced using the metal mask 20 or the screen mask 26, and an electrode is produced on the surface 4 of solar cell 1 using the above-described production methods.

Since the electrode of the prior art solar cell is produced by using evaporation of metal or printing of a conductive resin, the thickness of the electrode is restricted from about several microns to about several tens of microns according to the respective method. Therefore, in order to minimize the power loss, the width of the electrode needs to be broad or the number of electrodes needs to be increased. For example, when the electrode is produced by evaporation of silver to a thickness of 5 microns (resistivity $\rho = 1.6 \times 10^{-6} \Omega \cdot cm$), in order to obtain a resistance approximately equal to that of copper wire of 50 microns diameter, the width has to be about 370 microns. When the electrode is produced by screen printing of a conductive resin including Ag to a thickness of 50 microns (resistivity $\rho = 5 \times 10^{-5} \Omega \cdot cm$), the width thereof has to be about 1160 microns. As a result, the area of the electrode on the surface of solar cell becomes large, reducing the effective light incidence area of the solar cell and the generated current is reduced. Furthermore, the power loss at these electrodes is undesirably high.

SUMMARY OF THE INVENTION

It is an object of the present invention to provide a solar cell electrode structure, a production method therefor, and a production apparatus therefor that increases the effective area of the solar cell, reduces the power loss at the electrode, and is superior in mass-producibility.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, in an electrode structure of a solar cell, a metal wire is fixed to the surface of solar cell using a conductive adhesive material. Therefore, a metal wire having a large cross-sectional area and a narrow width can be fixed to the surface of solar cell, whereby the power loss at the electrode is reduced and the effective area of the element is increased.

According to another aspect of the present invention, an electrode production method includes applying a conductive adhesive material in an appropriate quantity to at least either a portion of the surface of a metal wire or a portion of the surface of a solar cell, and fixing the metal wire to a predetermined position on the surface of the solar cell. Thereby, the area occupied by the electrode is minimized and thus the effective area of the solar cell is increased.

According to still another aspect of the present invention, an electrode production apparatus includes means for holding a metal wire at a predetermined position, means for applying conductive adhesive material to at least one of a portion of the metal wire and a portion of the surface of a solar cell, means for applying the metal wire to the surface of the solar cell, and means for fixing the metal wire onto the surface of the solar cell by solidifying the conductive adhesive material. Thereby, the electrode structures according to the present invention can be successively produced on a plurality of surfaces of solar cells.

BRIEF DESCRIPTION OF THE DRAWINGS

FIGS. 3(a) and (b) are cross-sectional views illustrating process steps for producing the electrode structure of FIG. 1, according to an embodiment of the present invention;

FIG. 4 is an external view of the solar cell having the electrode structure of FIG. 2, according to an embodiment of the present invention;

FIGS. 5 and 6 are cross-sectional views of electrode structures of a solar cell according to second and third embodiments of the present invention, respectively;

DETAILED DESCRIPTION OF THE PREFERRED EMBODIMENTS

An embodiment of the present invention will be described in detail with reference to the drawings.

Figure 1:
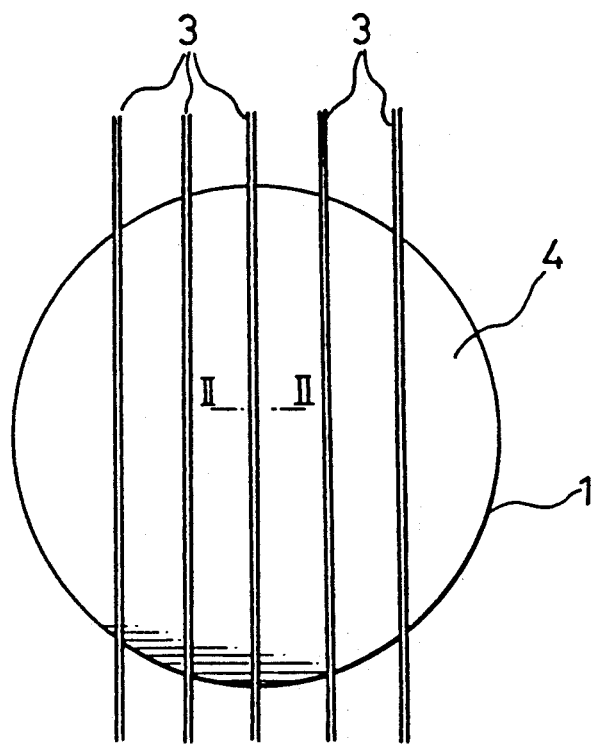
FIG. 1 is a plan view showing an electrode structure of a solar cell according to a first embodiment of the present invention.
Figure 2:
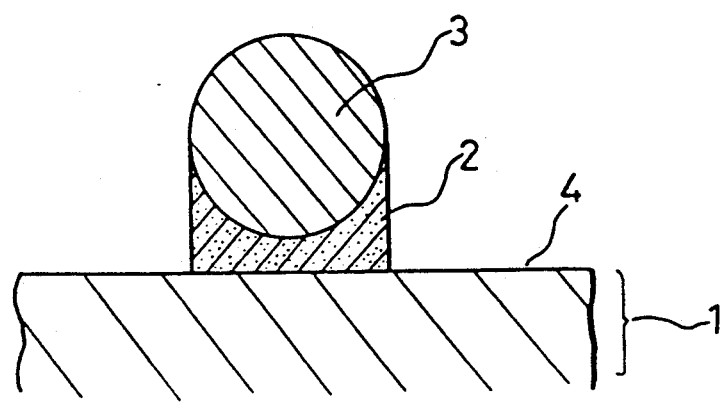
FIG. 2 is a cross-sectional view taken along line II—II of FIG. 1.

FIG. 1 shows a plan view of a solar cell electrode structure according to a first embodiment of the present invention. FIG. 2 is a cross-sectional view taken along line II—II FIG. 1. In these figures, metal wire 3 is a circular cross-sectional copper wire of 50 microns diameter fixed onto the surface 4 of solar cell 1 using a conductive adhesive materal 2. This conductive adhesive material 2 is a conductive resin of a low-temperature-baking type, which comprises a mixture of silver particles and epoxy resin.

FIG. 4 shows an external view of solar cell 1 of the above-described embodiment. In FIG. 4, reference numeral 5 designates a collection electrode for collecting current flowing through the respective metal wires 3. The currents generated at the solar cell 1 flow into the metal wires 3, they are collected by the collection electrode 5, and the collected current is supplied outside of solar cell 1.

Figure 12A:
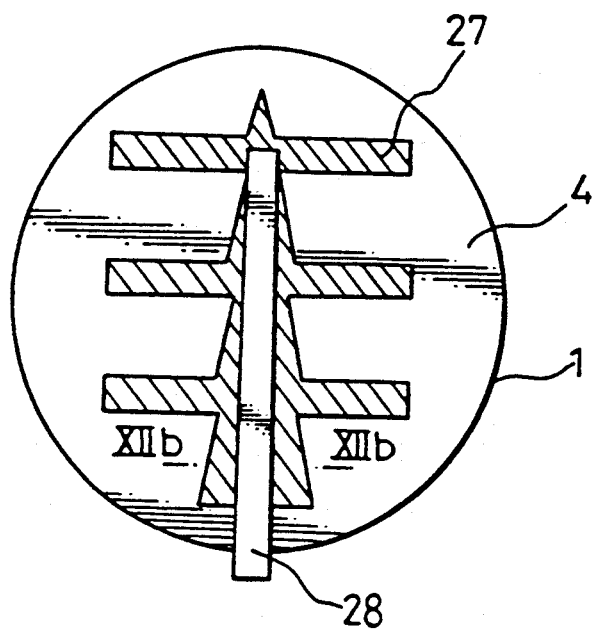
FIG. 12(a) is a plan view of an electrode structure of a solar cell according to the prior art.
Figure 12B:
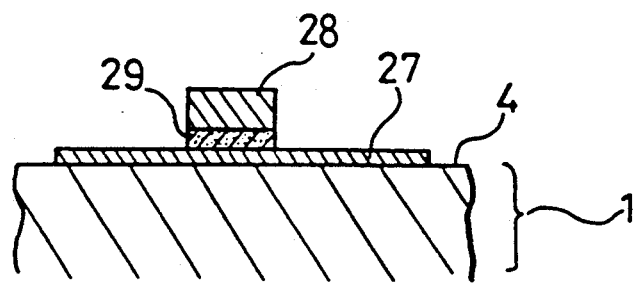
FIG. 12(b) is a cross-sectional view taken along line VIIb—VIIb of FIG. 12(a)

In the prior art electrode structure shown in FIG. 12, a metal pattern 27 is previously provided on the surface 4 of solar cell 1 by evaporation, sputtering, or screen printing, and a metal ribbon 28 with high conductivity is fixed to the metal pattern by soldering. In the electrode structure of this embodiment, a metal wire 3 is directly fixed onto the surface 4 of solar cell 1 using the conductive adhesive material.

In this embodiment, the width of the electrode is narrower than that of the prior art device, and a metal wire 3 having a larger cross-sectional area is fixed onto the surface 4 of solar cell 1 using conductive adhesive material 2. Therefore, the power loss at the electrode can be lowered and the effective light incidence area can be enlarged. For example, when the electrode is a copper wire of 50 microns diameter (resistivity $\rho=1.7\times 10^{-6}\Omega\cdot cm$) as in this embodiment, the effective i.e., light incident, area in a square 10 cm on a side (i.e., an area of 100 cm$^2$) is 94 cm$^2$. On the other hand, in the prior art electrode structure, when the electrode is silver of 5 microns thickness (resistivity $\rho=1.6\times 10^{-6}\Omega\cdot cm$), the width of electrode has to be 370 microns in order to obtain a resistance equal to the 0.0866 $\Omega$/cm of the copper electrode of this embodiment, and the effective i.e., light incident, area over a square 10 cm on a side is 87 cm$^2$. This means that the light incident area is considerably increased in the present invention.

While in the above-described embodiment a single solar cell is provided with the electrode structure of the present invention as shown in FIG. 2, several solar cells may include the electrode structure of the present invention at the same time. Furthermore, one or a plurality of solar cells provided with the electrode structure may be electrically connected with each other as a solar cell module.

While in the above-illustrated embodiment a thermosetting resin including silver particles is used as the conductive adhesive material 2, the conductive adhesive material is not restricted thereto. For example, the principal component thereof may be a fusible metal such as a solder or alloy, or the conductive adhesive material may include particles of an electrically conductive oxide such as SnO$_2$ or ITO (In$_2$O$_3$, SnO$_2$).

Futthermore, the resin 2 may be a polyester resin, an acryl resin, a polyvinyl resin, or a polyurethane resin and so on, besides an epoxy resin.

While in the above-illustrated embodiment, a copper wire having a circular cross-section of 50 microns diameter is used as the metal wire 3, the metal wire may have a noncircular, for example, a rectangular, cross-section.

FIG. 5 shows a metal wire 3 having a rectangular cross-section. When such metal wire 3 is adhered to the surface 4 of solar cell 1, a more stable adhesion surface is obtained than with a metal wire having a circular cross-section.

FIG. 6 shows a metal wire 3 having a concave shaped cross-section. When such a metal wire is used, since the conductive adhesive material 2 can be disposed in the concave portion, swelling of excessive adhesive material 2, which is likely to occur while adhering the metal wire 3 onto the surface 4 of solar cell 1, can be prevented.

The metal wire 3 is not necessarily copper. Other metals or an alloy including copper as the main component may be used.

Furthermore, a metal or alloy may be plated over a portion or all of the surface of metal wire 3. Then, the adhesion to the conductive adhesive material 1 is improved.

An embodiment of an electrode production method of the present invention will be described.

FIGS. 3(a) to 3(b) show an electrode production method according to an embodiment of the present invention. In FIG. 3, the same reference numerals designate the same or coresponding elements as those shown in FIGS. 1 and 2.

First of all, a metal 3 comprising a copper wire having a circular cross-section 50 microns in diameter is brought into contact with the conductive adhesive material 2 which has been previously spread in an appropriate thickness, (FIG. 3(a)). Thus, the conductive adhesive material 2 is transcribed to metal wire 3.

Thereafter, the metal wire 3 to which the conductive adhesive material 2 is applied is adhered to the surface 4 of solar cell 1. Then, this arrangement is heated in a high temperature ambient, thereby fixing the metal wire 3 onto the surface 4 of solar cell 1 by solidifying the conductive adhesive material 2. Thus, the electrode structure of the present invention is produced (FIG. 3(b)).

In such a production method of the present invention, since the transcribing process is used to produce the electrode, the swelling of adhesive material is minimized while the metal wire 3 is adhered to the surface 4 of solar cell 1.

Figure 9:
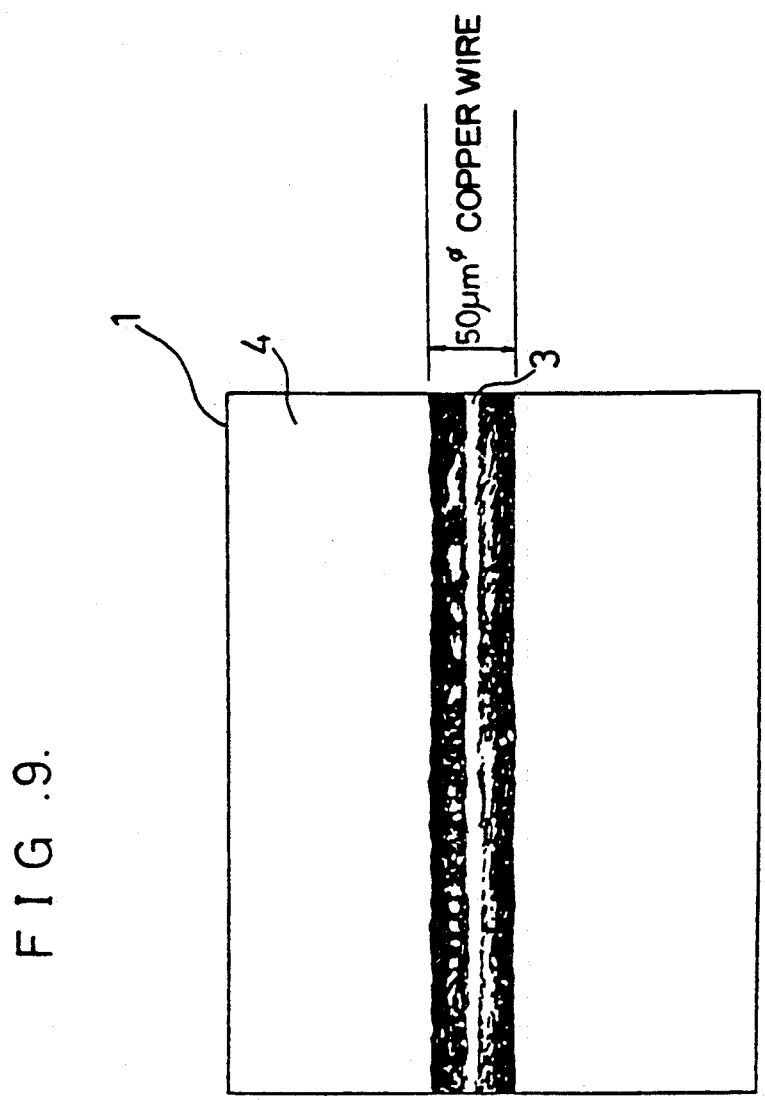
FIG. 9 is a plan view showing the adhesion of an electrode obtained in the electrode production method according to an embodiment of the present invention.
Figure 10:
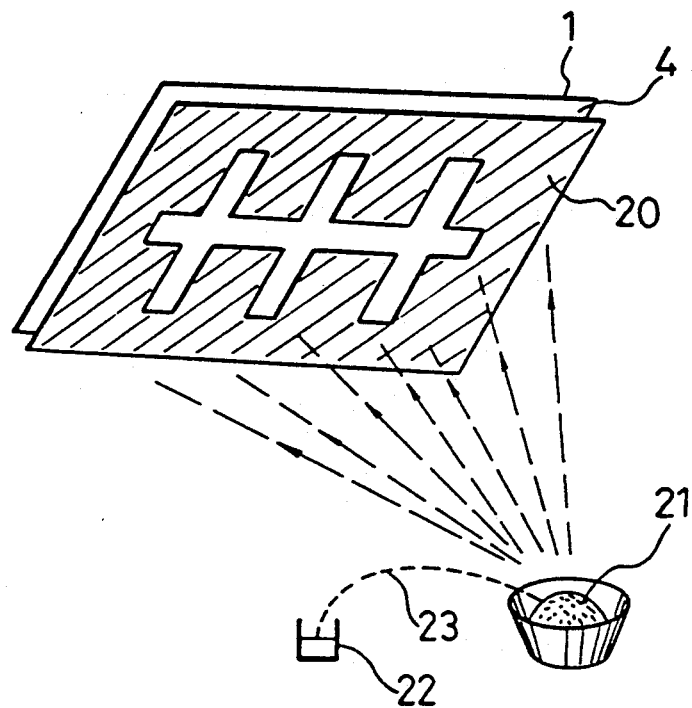
FIGS. 10 and 11 are diagrams showing production processes for producing solar cell electrodes according to the prior art.
Figure 11:
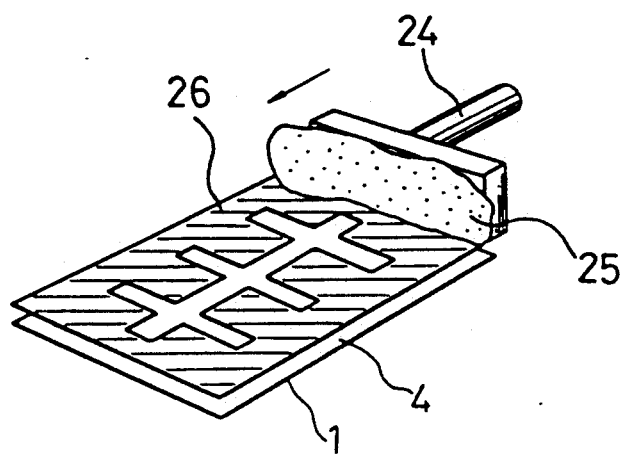
Figure 13:
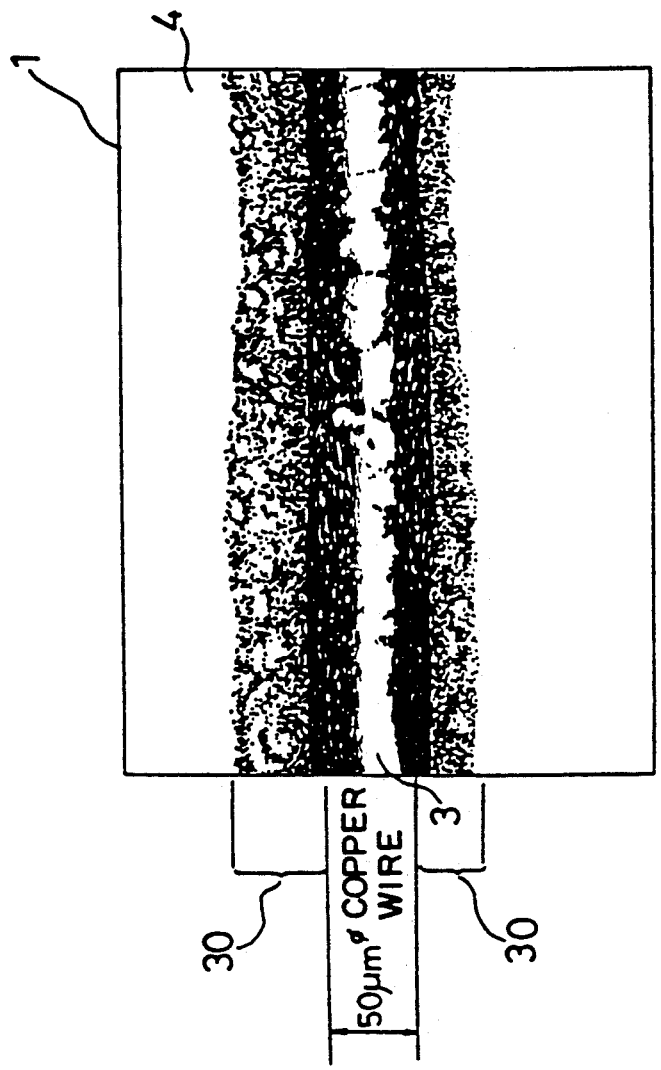
FIG. 13 is a plan view showing the adhesion of an electrode produced without using a transcribing method.

FIG. 9 illustrates the adhesion of an electrode produced according to the present invention while FIG. 13 illustrates the adhesion when the metal wire 3 is fixed onto the surface 4 of solar cell 1 without using the transcribing process. In these figures, the same reference numerals designate the same or corresponding elements as those shown in FIG. 3, and reference numeral 30 designates a swollen portion of conductive adhesive material 2. As is apparent from FIGS. 9 and 13, while the swelling of the adhesive material does not arise in the electrode production method using the transcribing process of the present invention, the swollen portions 30 of adhesive material arise at both sides of copper wire 3 of 50 microns diameter in the production method not using the transcribing process, and thus the electrode occupies a considerably larger area.

In the electrode production method of the present invention, since a transcribing process is used, the area occupied by the electrode can be reduced to about ½ relative to a case where the transcribing process is not used, whereby the effective area is further increased.

While in the above-illustrated embodiment conductive adhesive material 2 is transcribed to the surface of metal wire 3, and thereafter this metal wire 3 is adhered and fixed onto the surface 4 of solar cell 1, the conductive adhesive material 2 may be applied to a predetermined position on the surface 4 of solar cell 1 or it may be applied both to the surface of metal wire 3 and the surface 4 of solar cell 1.

Furthermore, the conductive adhesive material 2 may be previously applied and thereafter solidified to the entirety or a portion of the predetermined region where the metal wire 3 is to be fixed. Thereafter, the metal wire 3 may be fixed using the conductive adhesive material 2 according to the above described production method. In this case, in order to prevent the swelling of conductive adhesive material 2, the adhesive material 2 may be applied and thereafter solidified on the surface 4 of solar cell 1 using a metal wire finer than the metal wire 3, and thereafter, the metal wire 3 may be fixed thereon by the above-described method.

While in the above-illustrated embodiment heating is employed for solidifying the conductive adhesive material because a thermosetting resin is used as the conductive adhesive material, other solidification methods may be employed according to the characteristics of conductive adhesive material used.

Furthermore, while in the above-illustrated embodiment the device is heated in a high temperature ambient, it may be heated using the heat produced when a current flows through the metal wire 3.

Figure 7:
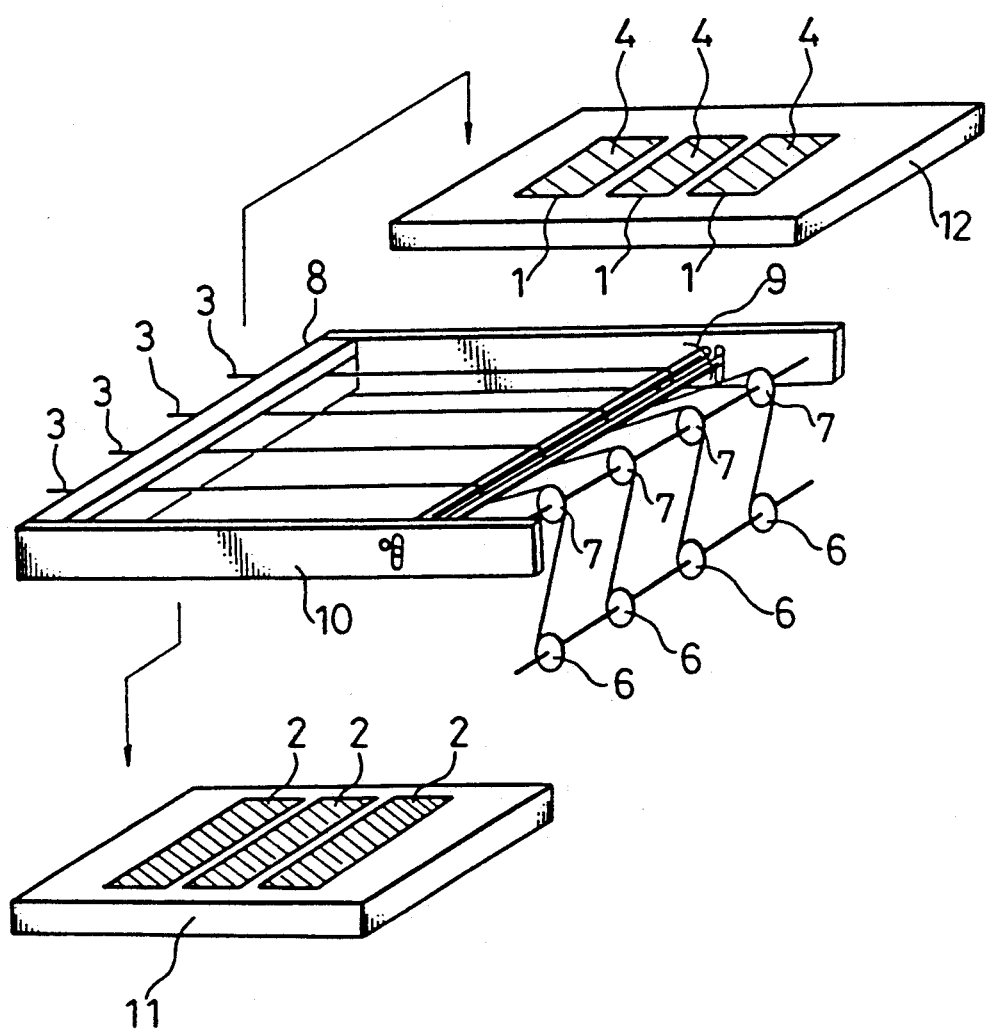
FIG. 7 is a perspective view showing a production apparatus for producing the electrode structure of FIG. 1, according to an embodiment of the present invention.

An electrode production apparatus according to an embodiment of the present invention will be described with reference to the drawings. FIG. 7 shows an electrode production apparatus according to the present invention. In FIG. 7, reference numeral 6 designates a bobbin for supplying a metal wire 3. Reference numeral 7 designates a pulley. Reference numeral 8 designates a clamp for fixing the metal wires 3. Reference numeral 9 designates means for adjusting the tension of metal wires 3. Reference numeral 10 designates a supporting frame. Reference numeral 11 designates a plate on which conductive adhesive material 2 is spread. Reference numeral 12 designates a plate for supporting solar cells 1 thereon.

This electrode production apparatus will operate as follows.

The metal wires 3 of required length are pulled out from the bobbins 6, and they are clamped by the clamp 8 through the pulleys 7. In this embodiment, four metal wires 3 are pulled out and fixed at the same time. Portions of the metal wires 3 are pressed down by the tension adjusting mechanism 9, and tension appropriate for keeping the metal wires 3 straight is applied. The pulleys 7, the clamp 8, and the tension adjusting mechanism 9 are incorporated in the supporting frame 10. Next, the metal wires 3 which are held by the supporting frame 10 are brought into contact with the conductive adhesive material 2 which is previously spread in an appropriate thickness on the plate 11 in accordance with a predetermined pattern, thereby applying the conductive adhesive material 2 to the surfaces of the metal wires 3. Next, the supporting frame 10 is moved to a position above the solar cell supporting plate 12 and the frame 10 is aligned with the plate 12. Thereafter, the metal wires 3 to which the conductive adhesive material is applied are pressed onto the surfaces 4 of solar cells 1. Next, this assembly is heated in a high temperature ambient by a heating mechanism (not shown), whereby the conductive adhesive material 2 is solidified and the metal wires 3 are fixed onto the surfaces 4 of solar cells 1. Thereafter, the metal wires 3 are cut into appropriate lengths by a cutting mechanism (not shown) to separate the solar cells 1 from the supporting frame 10, thereby completing the production of the electrodes.

When the solar cell module including the solar cells having such electrode structure was subjected to an exposure test in open air, no abnormality such as peeling occurred after 450 days. Furthermore, under a temperature cycle test between 85° C. and −40° C. for 50 cycles, no abnormalities such as peeling or cracks, and no welding defects were observed. These results confirm that the use of the metal wire electrode fixed by the conductive adhesive material 2 is practical.

While in the above-illustrated electrode production apparatus, the clamp 8, pulleys 7, and the tension adjusting mechanism 9 which are mounted in the supporting frame 10 are utilized to hold the metal wires 3 which are pulled out from the bobbins 6, other structures for holding the metal wires 3 may be employed.

While in the above-illustrated embodiment four metal wires are processed at the same time, the number of metal wires may be changed in accordance with the current generated by the solar cell 1.

While in the above-illustrated embodiment the metal wire 3 is brought into contact with the conductive adhesive material 2 which is previously spread in an appropriate thickness on the plate 11 to apply the conductive adhesive material 2 to the metal wire 3, other methods may be employed.

Figure 8:
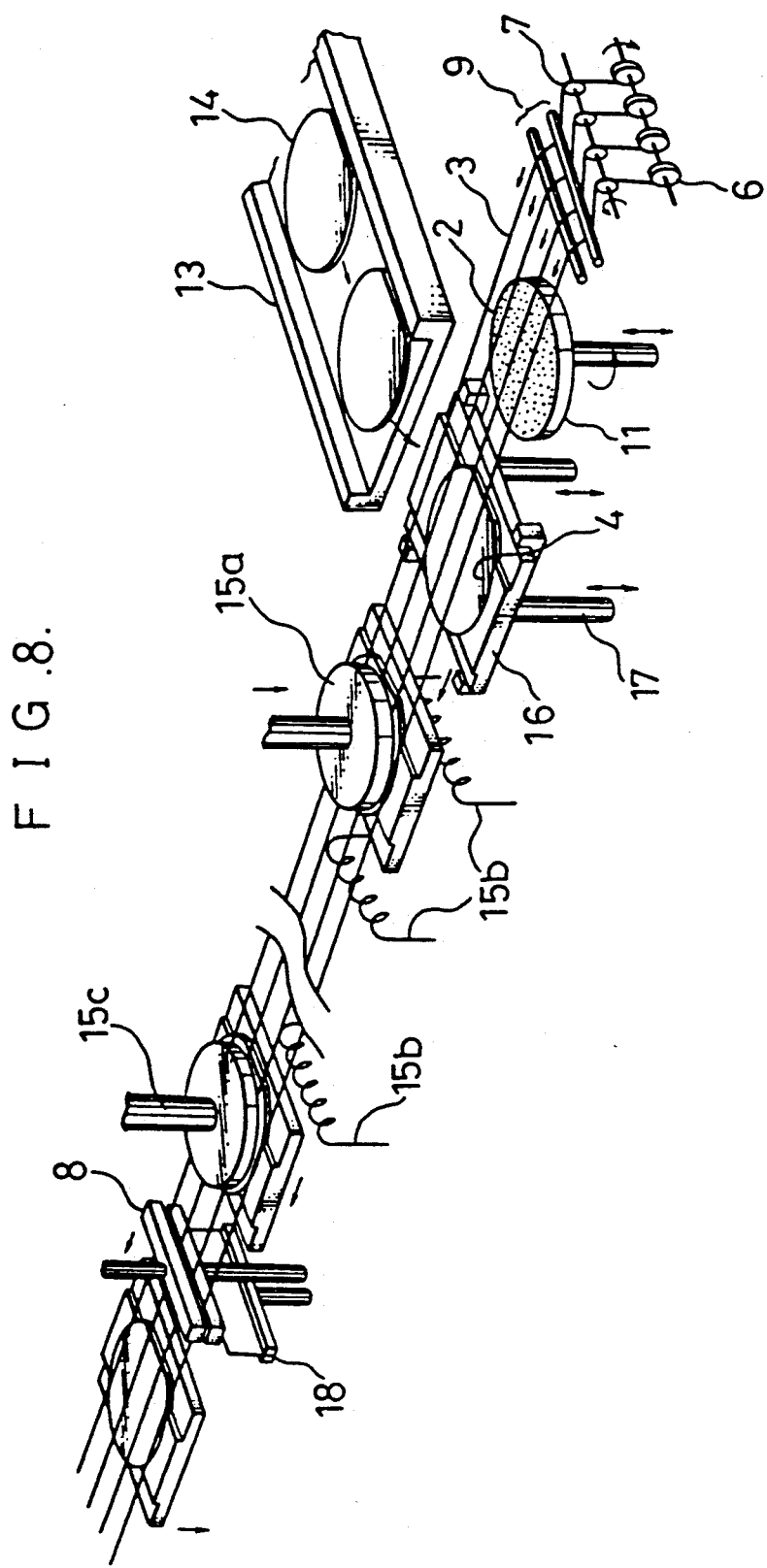
FIG. 8 is a perspective view showing further details of the apparatus of FIG. 7.

FIG. 8 shows a more complete apparatus incorporating the electrode production apparatus of FIG. 7 which is useful in the actual production process.

In FIG. 8, the same reference numerals designate the same or corresponding elements as those shown in FIG. 7. Reference numeral 13 designates a solar cell supplying mechanism for continuously supplying solar cells 14 to the solar cell holder 16. Reference numerals 15a, 15b, and 15c designate heating mechanisms. Reference numeral 17 designates a holder supporter. Reference numeral 18 designates a cutting mechanism for cutting the metal wire 3.

This apparatus will operate as follows.

The metal wires 3 are pulled out from the bobbins 6 and are stretched between the pulleys 7 and the clamp 8. In this embodiment, four metal wires are processed at the same time. The tension adjusting means 9 absorbs the stretching of metal wire 3 due to for example, heating, whereby a constant tension is applied to the metal wires 3 and a straight line is maintained. The metal wires 3 are successively pulled out from the bobbins 6 in response to the movement of the clamp 8. A table (conductive adhesive material plating plate 11) on which the conductive adhesive material 2 is applied, comes in contact with the metal wires 3 which are pulled out from the bobbins 6, and a predetermined quantity of conductive adhesive material 2 is transcribed to the lower surfaces of metal wires 3. The table 11 once comes in contact with the metal wires 3, and thereafter it rotates by a predetermined angle each time an appropriate amount of the conductive adhesive material is transcribed to the metal wires 3, whereby a new portion of adhesive material 2 successively comes in contact with the metal wires 3.

Solar cells 14 are continuously supplied from the solar cell supplying mechanism 13. The solar cell holder 16 is supported by the holder supporter 17. When a solar cell 14 is supplied to the solar cell holder 16 and portions of metal wires 3 to which the conductive adhesive material 2 is applied move to above the solar cell 14, the holder supporter 17 rises up and the surface 4 of solar cell 14 is brought into contact with the metal wires 3. Claws for positioning the solar cell 14 are provided on the solar cell holder 16. When the solar cell 14 comes into contact with the metal wires 3, the solar cell holder 16 is moved in accordance with the movement of metal wires 3, keeping them steady, and the solar cell holder 16 is moved from the holder plate 17 to the holder carrier mechanism (not shown).

Next, the metal wires 3 are pressed onto the surface 4 of solar cell 14 by the heating mechanism 15a, whereby they are heated. Furthermore, the solar cell 14 is heated under the solar cell holder 16 by another heating mechanism 15b. The solar cell holder 16 is carried by the holder carrier mechanism in synchronism with the movement of metal wires 3, and the upper heating mechansim 15a also moves, keeping the metal wires 3 pressed onto the solar cell 14, until solidification of the conductive adhesive material 2 is completed.

When the conductive adhesive material 2 is solidified, a second clamp (not shown) which is holding the metal wires 3 clamps the metal wires 3 at the side of clamp 8 where the side of tension adjusting means 9 is located, and the metal wires 3 at the solar cell holder 16 side of clamp 8 are cut. Thereafter, the solar cell 14 is taken out from the solar cell holder 16. Then, the solar cell holder 16 is restored to the holder supporter 17. When the metal wire 3 is cut, the second clamp holding the metal wire 3 at this side of cutting means 18 (the side of tension adjusting means 9) tensions the metal wire 3. Then, the clamp 8 may release the metal wire 3 because no tension of metal wire 3 is applied to the clamp 8 which has been holding the metal wire 3. The two clamps alternately pull and move the metal wire 3.

As discussed above, the electrode production apparatus of this embodiment successively produces a plurality of electrode structures on a plurality of solar cells according to the present invention, easily and rapidly.

While in the above-illustrated embodiment the respective solar cells are separated from each other, a plurality of solar cells may be produced together.

Figure 14:
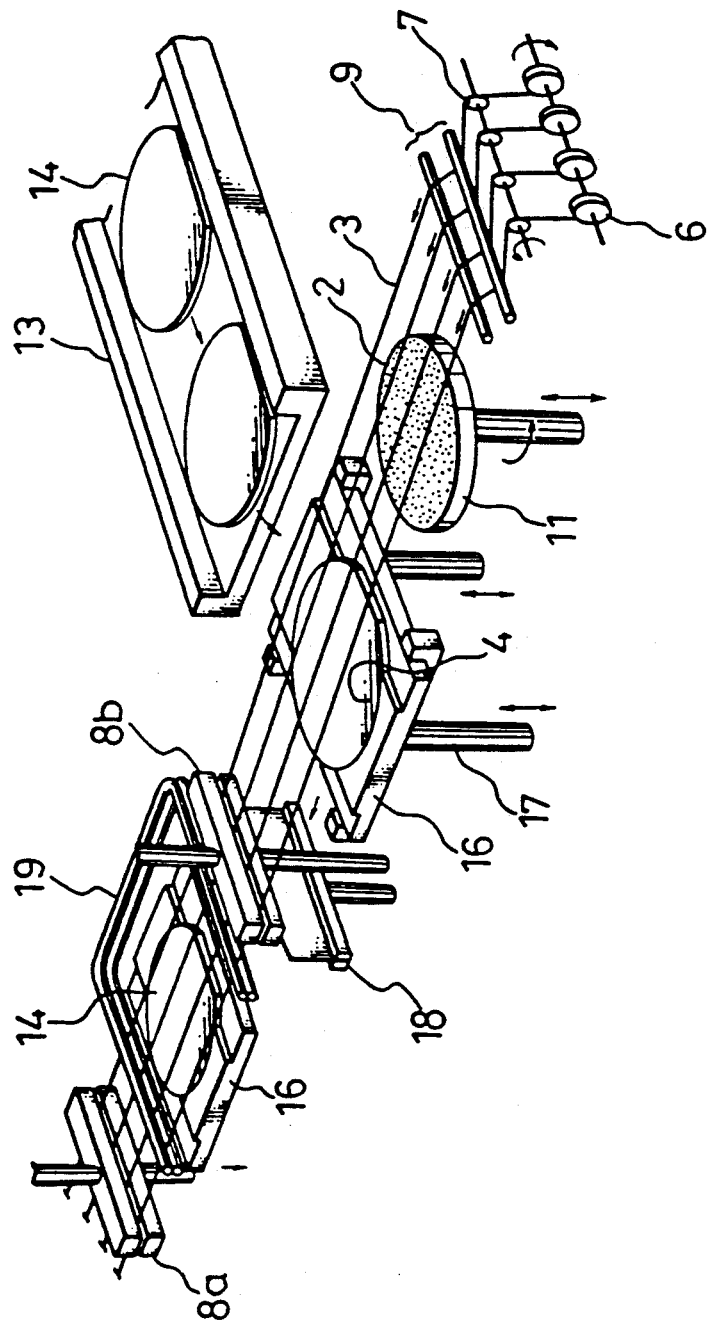
FIG. 14 is a diagram showing a production apparatus for producing an electrode structure according to still another embodiment of the present invention.

Furthermore, while in the above-illustrated embodiment the metal wire 3 is separated after the conductive adhesive material 2 is solidified, the conductive adhesive material 2 may be solidified after the metal wire 3 is separated. In this case, as shown in FIG. 14, the metal wires 3 are pulled out due to the movement of the clamp 8a, and the metal wires 3 are clamped at the both sides of solar cell holder 16 by tension maintaining means 19, thereby tightly stretching the metal wires 3. Then, the metal wires 3 at this side of solar cell holder 16 are clamped by another clamp 8b, and the metal wires 3 are cut off by the cutting means 18. The separated solar cell holder and the metal wires are sent to the heating means with the tension maintaining means 19, and the conductive adhesive material 2 is then solidified. By employing such a process, the length of the extended metal wire 3 can be determined independent of the time required for the solidification.

As is evident from the foregoing description, according to the present invention, because a metal wire is fixed onto the surface of solar cell using a conductive adhesive material, an electrode having a smaller width and a larger cross-sectional area can be produced, whereby the power loss at the electrode is reduced and the effective area of the solar cell is increased.

The electrode of the present invention is produced by a process in which conductive adhesive material of appropriate quantity is applied to at least one of a portion of the surface of a metal wire or a portion of surface of a solar cell and the metal wire is fixed to a predetermined position on the surface of a solar cell. Therefore, swelling of conductive adhesive material is suppressed and the occupation area of the electrode is minimized so that the effective area of the solar cell is increased.

Furthermore, the electrode production apparatus of the present invention includes means for holding the metal wire at a predetermined position, means for applying the conductive adhesive material to a predetermined position on the surface of the solar cell or the metal wire, and means for fixing the metal wire to the surface of solar cell. Therefore, the electrode structures of the present invention can be successively produced on a plurality of surfaces of solar cells. Thus, the production of the electrode structure is simplified.

What is claimed is:

1. A solar cell comprising:

a semiconductor solar cell body including a light incident surface; and a metallic wire including a surface plating of one of a metal and alloy, said wire being fixed to the light incident surface with an electrically conductive adhesive.

2. The solar cell of claim 1 wherein said electrically conductive adhesive is filled with particles of an electrically conductive oxide.

3. The solar cell as defined in claim 1 wherein said electrically conductive adhesive comprises a thermosetting resin.

4. The solar cell as defined in claim 1 wherein said metallic wire consists of one of a metal and an alloy.

5. The solar cell as defined in claim 4 wherein said wire is an alloy comprising mainly copper.

6. The solar cell as defined in claim 1 wherein said metallic wire has a circular cross-section.

7. The solar cell as defined in claim 1 wherein said metallic wire has a non-circular cross-section.

8. A solar cell module including a solar cell having a light incident surface and an electrode structure comprising metallic wire including a surface plating of one of a metal and alloy, said wire being fixed to the light incident surface of said solar cell with an electrically conductive adhesive.

9. The solar cell module of claim 8 wherein said electrically conductive adhesive is filled with particles of an electrically conducting oxide.

10. A solar cell module as defined in claim 9 wherein said electrically conductive adhesive comprises a thermosetting resin.

11. A solar cell module as defined in claim 8 wherein said metallic wire consists of one of a metal and an alloy.

12. A solar cell module as defined in claim 11 wherein said wire is an alloy comprising mainly copper.

13. A solar cell module as defined in claim 8 wherein said metallic wire has a circular cross-section.

14. A solar cell module as defined in claim 8 wherein said metallic wire has a non-circular cross-section.

15. A solar cell comprising:

a semiconductor solar cell body including a light incident surface;

a metallic wire including a concave surface; and an electrically conductive adhesive material disposed on the light incident surface in contact with and confined by the concave surface of said metallic wire, bonding said wire to said solar cell body.

16. A solar cell as defined in claim 15 wherein said electrically conductive adhesive comprises a thermosetting resin filled with metal particles.

17. A solar cell module including a solar cell having a light incident surface and an electrode structure comprising:

a metallic wire including a concave surface; and an electrically conductive adhesive disposed on the light incident surface in contact with and confined by the concave surface of said metallic wire, bonding said wire to said solar cell.

18. A solar cell module as defined in claim 17 wherein said electrically conductive adhesive comprises a thermosetting resin filled with metal particles.

* * * * *